(12) United States Patent
He et al.

(10) Patent No.: US 9,960,456 B2
(45) Date of Patent: May 1, 2018

(54) METHOD, MODULE FOR ACTIVATING BATTERY AND TERMINAL

(75) Inventors: Zhibin He, Shenzhen (CN); Zhongzhi Liu, Shenzhen (CN)

(73) Assignee: ZTE CORPORATION, Shenzhen, Guangdong (CN)

( * ) Notice: Subject to any disclaimer, the term of this patent is extended or adjusted under 35 U.S.C. 154(b) by 708 days.

(21) Appl. No.: 14/379,237

(22) PCT Filed: Jun. 12, 2012

(86) PCT No.: PCT/CN2012/076798
§ 371 (c)(1),
(2), (4) Date: Aug. 15, 2014

(87) PCT Pub. No.: WO2013/120332
PCT Pub. Date: Aug. 22, 2013

(65) Prior Publication Data
US 2015/0010783 A1 Jan. 8, 2015

(30) Foreign Application Priority Data
Feb. 17, 2012 (CN) .......................... 2012 1 0036001

(51) Int. Cl.
*H01M 10/44* (2006.01)
*H01M 10/42* (2006.01)
(Continued)

(52) U.S. Cl.
CPC ......... *H01M 10/425* (2013.01); *H01M 10/42* (2013.01); *H01M 10/4242* (2013.01);
(Continued)

(58) Field of Classification Search
CPC ...... H01M 10/42; H01M 10/44; H02J 7/0081; H02J 7/0083; G01R 31/36
See application file for complete search history.

(56) References Cited

U.S. PATENT DOCUMENTS

| 8,040,107 B2 | 10/2011 | Ishii |
| 2002/0193955 A1* | 12/2002 | Bertness ............ G01R 31/3627 702/63 |

(Continued)

FOREIGN PATENT DOCUMENTS

| CN | 101359840 A | 2/2009 |
| CN | 101431565 A | 5/2009 |

(Continued)

OTHER PUBLICATIONS

International Search Report for PCT International Patent Application No. PCT/CN2012/076798, dated Dec. 6, 2012.

*Primary Examiner* — James Lee
(74) *Attorney, Agent, or Firm* — Pearl Cohen Zedek Latzer Baratz LLP

(57) ABSTRACT

The disclosure provides a method, module and terminal for automatically activating a battery. The module for activating the battery comprises a detection unit, an activation unit and a control unit. The method for activating the battery comprises the following steps: a value of at least one first working parameter and a value of at least one second working parameter of the battery are periodically collected, recorded and uploaded; a key section of the at least one first working parameter is determined and a variation value of the second working parameter corresponding to the key section of the first working parameter is computed; and the variation value of the second working parameter is compared with a preset value, the using state of the battery is determined according to a comparison result, and the battery is activated according to the using state.

16 Claims, 2 Drawing Sheets

(51) Int. Cl.
  *H02J 7/00*       (2006.01)
  *H01M 10/48*      (2006.01)
  *G01R 31/36*      (2006.01)

(52) U.S. Cl.
  CPC ......... *H01M 10/44* (2013.01); *H01M 10/443* (2013.01); *H01M 10/48* (2013.01); *H01M 10/486* (2013.01); *H02J 7/007* (2013.01); *H02J 7/0075* (2013.01); *G01R 31/3606* (2013.01); *G01R 31/3648* (2013.01); *H01M 2220/30* (2013.01); *Y02B 40/90* (2013.01); *Y02E 70/40* (2013.01)

(56) References Cited

U.S. PATENT DOCUMENTS

| | | |
|---|---|---|
| 2009/0124298 A1 | 5/2009 | Suzuki et al. |
| 2010/0211341 A1* | 8/2010 | Kinoshita ........ G01R 19/16542 |
| | | 702/63 |
| 2014/0336840 A1* | 11/2014 | Geinzer ................ H01M 10/44 |
| | | 700/297 |

FOREIGN PATENT DOCUMENTS

| | | |
|---|---|---|
| CN | 101719568 A | 6/2010 |
| WO | WO 2011050924 | 5/2011 |

\* cited by examiner

METHOD, MODULE FOR ACTIVATING BATTERY AND TERMINAL

CROSS-REFERENCE TO RELATED APPLICATIONS

This application is a National Phase Application of PCT International Application No. PCT/CN2012/076798, International Filing Date Jun. 6, 2012, claiming priority of Chinese Patent Application No. 201210036001.2, filed Feb. 17, 2012, which is hereby incorporated by reference.

TECHNICAL FIELD OF THE INVENTION

The disclosure relates to the field of battery for a terminal and in particular to a method and module for activating a battery and a terminal.

BACKGROUND OF THE INVENTION

Battery is the electric energy source of terminal devices, and if there is no battery, the application performance of the terminal device will be greatly reduced. A high-capacity high-performance battery can not only provide long duration capability for a terminal but can also protect the terminal, so that the terminal device can operate for a long time with high efficiency.

With the popularization of modern mobile phones, especially smart phones, the functions thereof are richer and richer, which have become necessary for user communication, office work and entertainment. Most people think highly of battery duration capability, 38% interviewees state that as long as the mobile phone can continue operating normally (such as dialing and answering, and receiving and sending short messages), they are satisfied and do not want to sacrifice the battery duration time for any additional functions. The data obtained from the after-sales market also demonstrates that customers do not satisfy with the service life of the battery being shorter and shorter and the charging efficiency being lower and lower to the greatest extent.

The reason that the service life of the battery becomes shorter and shorter may be: frequent and repeated high-potential charging and over-charging, battery over-discharging due to not be charged for a long time, etc. For common users, from the moment a terminal device is used, the performance of the battery will decrease gradually over time, and therefore, to retain the performance of the battery to the greatest extent means a lot.

SUMMARY OF THE INVENTION

The disclosure provides a method and module for activating a battery and a terminal, to retain the original performance of the battery to the greatest extent and solve the problem that the use time of the battery becomes shorter and the charging efficiency becomes lower after being fully charged with the use time being longer.

In a particular embodiment, the steps of the method for activating a battery provided by the disclosure are as follows:

periodically collecting, recording and uploading a value of at least one first working parameter and a value of at least one second working parameter of the battery;

determining a key section of the at least one first working parameter and computing a variation value of the at least one second working parameter corresponding to the key section of the first working parameter; and comparing the variation value of the at least one second working parameter with a preset value, determining using state of the battery according to a comparison result, and activating the battery according to the using state.

In a particular embodiment, in the above method for activating the battery, after periodically collecting, recording and uploading the value of the at least one first working parameter and the value of the at least one second working parameter of the battery, the method further comprises: drawing and uploading working parameter curve charts about the values of the at least one first and second working parameters according to the values of the at least one first and second working parameters. According to the drawn working parameter curve charts, variation value of the second working parameter corresponding to the key section of the first working parameter may be computed conveniently.

In a particular embodiment, in the above method for activating the battery, before activating the battery, the method further comprises: prompting a user to set activation time, receiving the activation time and issuing a battery activation instruction at the activation time. Prompting the user to set the activation time may facilitate the user in use and will not affect the normal life of the user.

In a particular embodiment, in the above method for activating the battery, before activating the battery, the method further comprises: controlling a terminal to be in deep sleep or shut down. After the terminal device enters deep sleep or shuts down, the activation operation on the battery will not affect the terminal device, thus protecting the terminal device of the user to a greater extent.

In a particular embodiment, in the above method for activating the battery, if the at least one first working parameter is a voltage of the battery, the at least one second working parameter is at least one of the following working parameters: electricity quantity, current, time, temperature or internal resistance of the battery; and if the at least one first working parameter is electricity quantity of the battery, the at least one second working parameter is at least one of the following working parameters: voltage, current, time, temperature or internal resistance of the battery.

In a particular embodiment, in the above method for activating the battery, the preset value is the variation value of the at least one second working parameter corresponding to the key section of the at least one first working parameter of a standard battery.

In a particular embodiment, in the above method for activating the battery, the mode for activating the battery is pulse charging or trickle charging or constant current and constant voltage charging; and a process of the constant current and constant voltage charging is particularly as follows: performing constant current discharging, constant current charging and constant voltage charging circularly and successively until the battery activation is completed. The method for detecting whether the battery activation is completed is that it is detected whether the variation value of the second working parameter corresponding to the key section of the first working parameter is the same as or proximate to the preset value, wherein the variation value of the second working parameter is computed by the control unit computes during activation, and if they are the same or proximate, then this battery activation is completed and this constant current and constant voltage charging operation will stop; otherwise, an activation operation will still be performed on the battery.

In a particular embodiment, the module for activating a battery provided by the disclosure comprises:

a detection unit configured to periodically collect, record and upload values of working parameters of the battery;

a control unit configured to determine using state of the battery and detecting whether the battery needs to be activated;

an activation unit configured to activate the battery;

wherein the detection unit, which is connected to the control unit, is configured to upload the values of the working parameters recorded by the detection unit to the control unit;

the control unit, which is connected to the detection unit and the activation unit, is configured to receive the values of the working parameters and issue an activation instruction to the activation unit when an activation operation needs to be performed on the battery; and the activation unit, which is connected to the control unit, is configured to activate the battery when receiving the activation instruction issued by the activation unit.

In a particular embodiment, in the above module for activating the battery, it further comprises a prompt unit which is connected to the control unit and configured to prompt a user to set activation time when receiving a prompt instruction issued by the activation unit, receive the activation time, and transmit the activation time to the control unit; and the control unit is further configured to issue the prompt instruction to the prompt unit, receive the activation time transmitted by the prompt unit and issue the activation instruction to the activation unit at the activation time.

In a particular embodiment, the above module for activating a battery further comprises a switching unit which is connected to the control unit and configured to, after receiving a switching instruction issued by the control unit, switch to an external power supply mode to provide electric energy to the battery on which an activation operation is performed; and the control unit is further configured to issue the switching instruction to the switching unit.

At the same time, the disclosure also provides a terminal, comprising an external power supply, a battery, a power consumption module, and a module for activating a battery in any of the above embodiments, wherein the module for activating the battery is connected to the external power supply, battery, and power consumption module.

The disclosure may be implemented to monitor the using state of a battery in real time, feed back information to a user in real time, obtain relevant execution instructions from the user, perform different activation operations on the battery, protect the battery to the greatest extent, and retain the original performance of the battery. The user will not worry about rich and colorful applications due to the decreasing of the performance of the battery, which can greatly improve the use experience of the user.

DETAILED DESCRIPTION OF THE INVENTION

Hereinafter, a detailed description is given to the embodiments of the disclosure with reference to the accompanying drawings.

Figure 1:
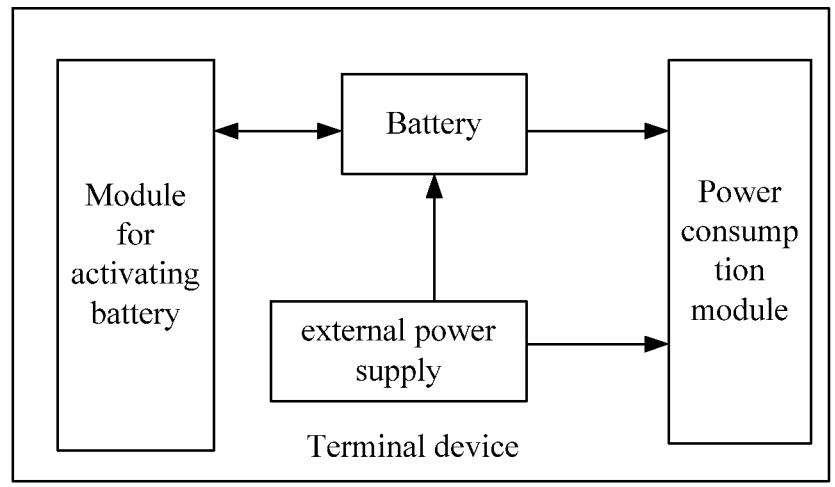
FIG. 1 is a structural schematic diagram of a terminal device according to an embodiment of the disclosure.
Figure 2:
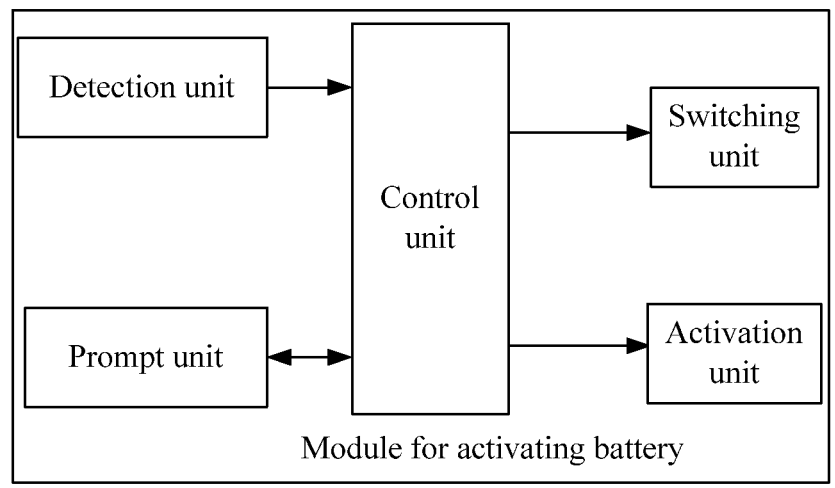
FIG. 2 is a structural schematic diagram of a module for activating a battery according to a preferred embodiment of the disclosure.

A detailed description is given to a module for activating a battery in an embodiment of the disclosure with reference to the FIGS. 1 and 2.

It can be seen from FIG. 1 that a power management module is applied on a terminal device in the embodiment of the disclosure, and the terminal includes an external power supply, a battery, a power consumption module and a power management module, wherein the forms of the external power supply include but not limited to adapter and USB charging methods; the battery includes but not limited to ni-mh, nickel-cadmium, and lithium ion batteries; the power consumption module, which is the power consumption unit of the terminal device, includes but not limited to the applications of the terminal device, such as display screen, processor, touch screen, or WiFi, Bluetooth, gravity sensor, acceleration, GPS, graphics processor and so on; and the power management module (PMU) is used for performing an activation operation on the battery and retain the original performance of the battery to the greatest extent.

The structure of the power management module (PMU) is as shown in FIG. 2, which includes a detection unit, a control unit, a prompt unit, an activation unit and a switching unit.

When there is an external power supply, the switching unit is configured to switch to an external power supply mode to power the power consumption module of the terminal device, to charge the battery, and to switch to the external power supply mode to power the battery activation operation when receiving a switching instruction issued by the control unit; and when there is no external power supply, the switching unit is configured to switch to the battery power supply mode to power the power consumption module of the terminal device.

The monitoring unit is configured to detect the using state of the battery in real time, to measure periodically working parameters (including but not limited to voltage, electricity quantity, current, internal resistance value, temperature, etc.), to upload the values of the working parameter values to the control unit, and to draw corresponding working parameter curve charts according to the values of the working parameters and upload same to the control unit.

The activation unit is configured to receive an activation instruction issued by the control unit and perform an activation operation on the battery according to the activation instruction. During the process of activating the battery, the switching unit also participates, and the switching unit switches to the external power supply mode and uses the external power supply to activate the battery, wherein the activation method for activating the battery includes but not limited to: pulse charging or trickle charging or constant current and constant voltage charging. Trickle charging, i.e., maintenance charging (float-charging) is compensation self-discharging, which is mainly applied to the maintenance and activation of the accumulator of direct current power systems such as telecommunication apparatuses, signal systems and so on, and trickle charging enables the accumulator to be maintained in constant small current charging which is similar to a complete charging state and to be in a trickle charging state after being charged completely, so as to be used during discharging. Pulse charging is mainly applied to the activation of nickel-cadmium batteries, and since nickel-cadmium batteries are easy to be polarized during conventional charging, conventional constant voltage or constant current charging would cause the electrolyte to produce oxyhydrogen gas constantly, the oxygen therein is penetrated to the negative electrode to interact with the cadmium plate to generate CdO under the internal high pressure, causing the active capacity of the electrode plate to decrease. Pulse charging usually employs a charging and discharging method, i.e., charging for 5 seconds and discharging for 1 second, so that most of the oxygen generated during charging will be restored to electrolyte under the discharging pulse, which not only limits the gasification amount of the internal electrolyte but also enables those already seriously polarized old batteries to gradually restore or approximate to the original capacity after being charged after the batteries discharged for 5 to 10 times using this charging method. The particular process of constant current and constant voltage charging is: performing constant current discharging, constant current charging and constant voltage charging circularly and successively, which is widely applied to the maintenance and activation of batteries such as lithium batteries, and the steps of which will be given out in the embodiments hereinafter.

The prompt unit is configured to prompt the user to set activation time after receiving a prompt instruction issued by the control unit and transmitting the activation time set by the user to the control unit.

The control unit is the nerve centre of the module for activating a battery, responsible for the communication among relevant units and the issuing of task instructions, including: receiving the values of the working parameters or curve charts of the working parameter of the battery uploaded by the detection unit; controlling the power supply mode of the terminal device and issuing the switching instruction to the switching unit; issuing an activation instruction to the activation unit; and issuing the prompt instruction to the prompt unit and receiving the activation time set by the user, and so on.

The particular work of the control unit is the following: after receiving the values of the working parameters or curve charts of the working parameters of the battery, at least one key section of the first working parameter is selected, a variation value of at least one second working parameter is selected in the key section of the first working parameter, this variation values is compared with a preset value (the preset value is a variation value of the at least one second working parameter which is corresponding to the standard battery and is in the key section of the at least one first working parameter). If it is found that this variation value is seriously deviated from the preset value, an interruption warning is issued in time to report a reason. The interruption warning and the reason are displayed to the user via the prompt unit, so that the user learns which factor of the battery exceeds the warning line. The user is prompted to select a relevant activation operation and activation time via a pre-stored relevant logic, and an activation instruction is issued at the activation time set by the user.

Figure 3:
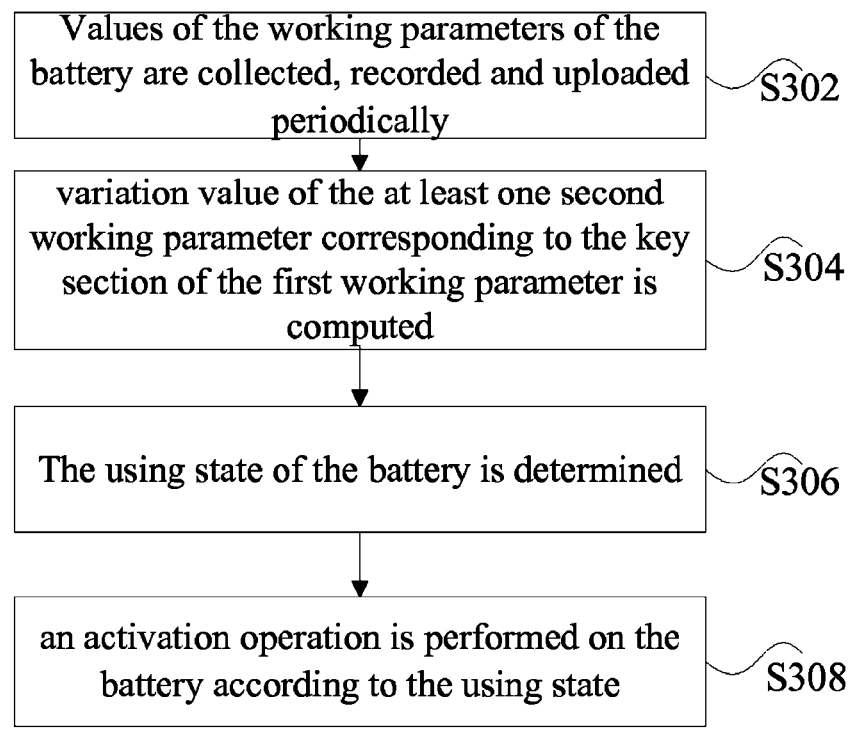
FIG. 3 is a flowchart of a method for activating a battery according to a preferred embodiment of the disclosure.

The work flow of a method for activating a battery according to an embodiment of the disclosure is described in conjunction with FIG. 3, and this flow includes the following step S302 to step S308.

Step S302: a value of at least one first working parameter and a value of at least one second working parameter of the battery are collected, recorded and uploaded periodically.

Step S304: a detection unit periodically detects the values of the working parameters of the battery, such as the voltage V, the current I, the time T, the electricity quantity Q, the battery temperature T, the internal resistance R and so on, and uploads the values of the detected working parameters, wherein when the at least one first working parameter is the voltage of the battery, the at least one second working parameter is at least one of the following working parameters: the electricity quantity, the current, the time, the temperature or the internal resistance of the battery; and when the at least one first working parameter is the electricity quantity of the battery, the at least one second working parameter is at least one of the following working parameters: the voltage, the current, the time, the temperature or the internal resistance of the battery. After collecting the required working parameters, the detection unit may also compute and draw a working parameter relationship curve chart of voltage V-electricity quantity Q (current I, time T, temperature T, internal resistance R) or electricity quantity Q-voltage V (current I, time T, temperature T, internal resistance R) and uploads the computed working parameter relationship curve charts.

Step S306: the values of the working parameters of the battery are received, a variation value of the at least one second working parameter corresponding to the key section of the first working parameter is computed, the variation value of the working parameters are compared with a preset value to determine using state of the battery.

After collecting relevant data, the detection unit sends the values of the working parameters or working parameter relationship curve charts to the control unit. The control unit performs detailed computation within several key sections of the at least one first working parameter to obtain a corresponding variation value of the at least one second working parameters and compare same with a preset value. Assuming that the first working parameter is the voltage V of the battery, the second working parameters are the electricity quantity Q and variation time T of the battery, the parameters to be judged include: one or more of the time $\Delta T$ and the electricity quantity value $\Delta Q$ used from voltage point V1 to V2, and if $\Delta Q$ or $\Delta T$ is less than the preset value, then it is deemed that the battery is in a sub-health state.

Step S308: an activation operation is performed on the battery according to the using state.

When the battery is in a sub-health state, an activation operation needs to be performed on the battery. At this moment, an activation operation may be performed on the battery according to an appointed solution autonomously, and the user may also be prompted to set a battery activation time, such as 24:00, then at 24:00, the module for activating a battery controls the terminal device to be deep sleep and perform a battery activation operation, which does not affect the use by the user.

The activation method for activating a battery includes but not limited to pulse charging or trickle charging or constant current and constant voltage charging. Hereinafter, it will be described in detail with a constant current and constant voltage charging activation method.

Step I, the control unit controls the terminal device to be in deep sleep or be shut down directly;

step II, the control unit issues a switching instruction, and the switching unit switches to an external power supply mode and perform an activation operation on the battery using an external power supply;

step III, the activation unit starts and discharges the battery firstly, using current C1 to discharge until voltage V1, (constant current discharging);

step IV, the control unit starts a timer and pends time T1;

step V, the battery is charged using large current C2 until voltage V2 (constant current charging);

Step VI, constant voltage V2 is maintained for charging battery until the current is less than C3 (constant voltage charging);

step VII, the control unit starts the timer and pends time T2;

step VIII, the control unit detects whether it needs to discharge the battery again. If yes, then perform step IX, otherwise, the activation operation is completed, and the terminal device restores to work normally;

step IX, the battery is discharged using current C1 until voltage V1;

step X, step IV to VIII are repeated.

Hereinafter, an embodiment of the disclosure will be described.

During the use by the user, Shown below is a method for detecting whether a battery needs to be activated (taking a 4000 mAh lithium battery as an example, selecting the voltage of the battery as the first working parameter, and the electricity quantity of the battery as the second working parameter):

1. after the charging is completed, clearing the initial values of time, voltage and electricity quantity. Time T3 and voltage V4 are saved, such as 2011.11.25 10:25:20, 4.15 v;

2. The current is monitored in real time, the electricity quantity is computed in real time, ΔQ is computed, and a real-time curve about voltage V, ΔQ, ΔT is drawn;

3. an electricity quantity variation value between voltage point 4.1-4.0 v is selected, which should be Q2 for a standard battery, such as 500 mAh. If ΔQ<Q2 at this moment, such as 300 mAh, then a warning is reported that the battery is in a sub-health state;

4. an electricity quantity variation value between voltage point 4.0-3.9 v is selected, which should be Q3 for a standard battery, such as 700 mAh, and if at this moment ΔQ<Q3, such as 600 mAh, then a warning is reported that the battery is in a sub-health state;

5. an electricity quantity variation value between voltage point 3.8-3.6 v is selected, which should be Q4 for a standard battery, such as 3600 mAh, and if at this moment ΔQ<Q4, such as 3000 mAh, then a warning is reported that the battery is in a sub-health state;

When the battery is in sub-health state, the module for activating a battery prompts the user to set a time to perform an activation operation on the battery via the prompt unit, such as 24:00 that day and so on.

During the use by the user, shown below is the steps and method for performing an activation operation on the battery (still taking a 4000 mAh lithium battery as an example, selecting a constant current and constant voltage charging activation method to perform battery activation):

1. the user plugs an external power supply adapter and selects a battery activation button;

2. the battery performs constant current discharging with current C1 such as 800 mA, until voltage V1 such as 3.0 v;

3. discharging time is time T1 such as 30 min;

4. the battery performs constant current charging with current C2 such as 1.5 A until voltage V2 such as 4.2 v;

5. a voltage of 4.2 v is maintained, and constant voltage charging is performed on the battery until the charging current is less than C3 such as 80 mA;

6. discharging time is time T2 such as 30 min;

7. the battery performs constant current discharging with current C3 such as 800 mA until voltage V3 such as 3.0 v;

8. step 3 to 6 are repeated until the control unit detects that the variation value of the second working parameter in the key section of the first working parameter is the same as or approximate to the preset value, then stop repeating, and the battery activation operation is completed.

During the above detection and activation process, all the working parameters of the battery (voltage V, current I, electricity quantity Q and time T) may be set by the user autonomously.

The foregoing is merely particular implementations of the disclosure and is not to limit the disclosure in any form, and any simple modifications, equivalent changes or decorations made on the above implementations according to the technical essence of the disclosure all belong to the scope of protection of the technical solution of the disclosure.

What is claimed is:

1. A method for activating a battery, comprising:
periodically collecting, recording and uploading a value of at least one first working parameter and a value of at least one second working parameter of the battery;
determining a key section of the at least one first working parameter and computing a variation value of the at least one second working parameter corresponding to the key section of the first working parameter; and
comparing the variation value of the at least one second working parameter with a preset value, determining using state of the battery according to a comparison result, and determining whether to activate the battery according to the using state;
wherein if the at least one first working parameter is a voltage of the battery, the at least one second working parameter is at least one of the following working parameters: electricity quantity, current, time, temperature or internal resistance of the battery; and if the at least one first working parameter is electricity quantity of the battery, the at least one second working parameter is at least one of the following working parameters: voltage, current, time, temperature or internal resistance of the battery.

2. The method for activating the battery of claim 1, wherein after periodically collecting, recording and uploading the value of the at least one first working parameter and the value of the at least one second working parameter of the battery, the method further comprises: drawing and uploading working parameter curve charts based the values of the at least one first working parameters and the values of the at least one second working parameters according to the values of the at least one first and second working parameters.

3. The method for activating the battery of claim 1, wherein before activating the battery, the method further comprises: prompting a user to set activation time, receiving the activation time and issuing a battery activation instruction at the activation time.

4. The method for activating the battery of claim 3, wherein before activating the battery, the method further comprises: controlling a terminal to be in deep sleep or shut down.

5. The method for activating the battery of claim 1, wherein the preset value is the variation value of the at least one second working parameter corresponding to the key section of the at least one first working parameter.

6. The method for activating a battery of claim 1, wherein a mode for activating the battery is pulse charging or trickle charging or constant current and constant voltage charging; and a process of the constant current and constant voltage charging is particularly as follows: performing constant current discharging, constant current charging and constant voltage charging circularly and successively until the battery activation is completed.

7. The method for activating a battery of claim 2, wherein a mode for activating the battery is pulse charging or trickle charging or constant current and constant voltage charging; and a process of the constant current and constant voltage charging is particularly as follows: performing constant current discharging, constant current charging and constant voltage charging circularly and successively until the battery activation is completed.

8. The method for activating a battery of claim 3, wherein a mode for activating the battery is pulse charging or trickle charging or constant current and constant voltage charging; and a process of the constant current and constant voltage charging is particularly as follows: performing constant current discharging, constant current charging and constant voltage charging circularly and successively until the battery activation is completed.

9. The method for activating a battery of claim 4, wherein a mode for activating the battery is pulse charging or trickle charging or constant current and constant voltage charging; and a process of the constant current and constant voltage charging is particularly as follows: performing constant current discharging, constant current charging and constant voltage charging circularly and successively until the battery activation is completed.

10. The method for activating a battery of claim 5, wherein a mode for activating the battery is pulse charging or trickle charging or constant current and constant voltage charging; and a process of the constant current and constant voltage charging is particularly as follows: performing constant current discharging, constant current charging and constant voltage charging circularly and successively until the battery activation is completed.

11. A module for activating a battery, comprising:
a detection unit configured to periodically collect, record and upload values of working parameters of the battery, wherein the values of working parameters of the battery include a value of at least one first working parameter and a value of at least one second working parameter of the battery;
a control unit configured to determine using state of the battery according to the values of working parameters of the battery and detecting whether the battery needs to be activated;
an activation unit configured to activate the battery;
wherein the detection unit, which is connected to the control unit, is configured to upload the values of the working parameters recorded by the detection unit to the control unit;
the control unit, which is connected to the detection unit and the activation unit, is configured to receive the values of the working parameters and issue an activation instruction to the activation unit when an activation operation needs to be performed on the battery, wherein the control unit is programmed to determine a key section of the at least one first working parameter and compute a variation value of the at least one second working parameter corresponding to the key section of the first working parameter, and further programmed to compare the variation value of the at least one second working parameters with a preset value, issue an activation instruction to the activation unit, when the variation value is determined to be deviated from the preset value; and
the activation unit, which is connected to the control unit, is configured to activate the battery when receiving the activation instruction issued by the activation unit;
wherein if the at least one first working parameter is a voltage of the battery, the at least one second working parameter is at least one of the following working parameters: electricity quantity, current, time, temperature or internal resistance of the battery; and if the at least one first working parameter is electricity quantity of the battery, the at least one second working parameter is at least one of the following working parameters: voltage, current, time, temperature or internal resistance of the battery.

12. The module for activating the battery of claim 11, wherein the method further comprises a prompt unit which is connected to the control unit and configured to prompt a user to set activation time when receiving a prompt instruction issued by the activation unit, receive the activation time, and transmit the activation time to the control unit; and the control unit is further configured to issue the prompt instruction to the prompt unit, receive the activation time transmitted by the prompt unit, and issue the activation instruction to the activation unit at the activation time.

13. The module for activating the battery of claim 11, wherein the module further comprises a switching unit which is connected to the control unit and configured to, after receiving a switching instruction issued by the control unit, switch to an external power supply mode to provide electric energy to the battery on which an activation operation is performed; and the control unit is further configured to issue the switching instruction to the switching unit.

14. A terminal, comprising an external power supply, a battery, and a power consumption module, further comprising: the module for activating the battery of claim 11; and the module for activating the battery is connected to the external power supply, the battery and the power consumption module.

15. A terminal, comprising an external power supply, a battery, and a power consumption module, further comprising: the module for activating the battery of claim 12; and the module for activating the battery is connected to the external power supply, the battery and the power consumption module.

16. A terminal, comprising an external power supply, a battery, and a power consumption module, further comprising: the module for activating the battery of claim 13; and the module for activating the battery is connected to the external power supply, the battery and the power consumption module.

* * * * *